(12) United States Patent
Ma (10) Patent No.: US 6,713,859 B1
(45) Date of Patent: Mar. 30, 2004

(54) DIRECT BUILD-UP LAYER ON AN ENCAPSULATED DIE PACKAGE HAVING A MOISTURE BARRIER STRUCTURE

(75) Inventor: Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 414 days.

(21) Appl. No.: 09/660,757

(22) Filed: Sep. 13, 2000

(51) Int. Cl.[7] ............................................... H01L 23/24
(52) U.S. Cl. ........................ 257/687; 257/706; 257/707
(58) Field of Search ................................. 257/687, 712, 257/701, 706, 707, 771

(56) References Cited

U.S. PATENT DOCUMENTS

| | | |
|---|---|---|
| 5,111,278 A | 5/1992 | Eichelberger |
| 5,291,066 A | 3/1994 | Neugebauer et al. |
| 5,353,498 A | 10/1994 | Fillion et al. |
| 5,422,513 A | 6/1995 | Marcinkiewicz et al. |
| 5,497,033 A | 3/1996 | Fillion et al. |
| 5,527,741 A | 6/1996 | Cole et al. |
| 5,703,400 A | 12/1997 | Wojnarowski et al. |
| 5,745,984 A | 5/1998 | Cole, Jr. et al. |
| 5,856,705 A | 1/1999 | Ting |
| 5,977,639 A | 11/1999 | Seshan et al. |
| 5,998,859 A * | 12/1999 | Griswold ..................... 257/679 |
| 6,154,366 A | 11/2000 | Ma et al. |
| 6,423,566 B1 * | 7/2002 | Feger et al. ................... 438/82 |

FOREIGN PATENT DOCUMENTS

| | | |
|---|---|---|
| EP | 0 938 138 A2 | 8/1999 |
| JP | 11-045955 | 2/1999 |
| JP | 11-312868 | 11/1999 |

* cited by examiner

*Primary Examiner*—Roy Potter
(74) *Attorney, Agent, or Firm*—Schwegman, Lundberg, Woessner & Kluth, P.A.

(57) ABSTRACT

A packaging technology that fabricates a microelectronic package including build-up layers, having conductive traces, on an encapsulated microelectronic die and on other packaging material that surrounds the microelectronic die, wherein an moisture barrier structure is simultaneously formed with the conductive traces. An exemplary microelectronic package includes a microelectronic die having an active surface and at least one side. Packaging material(s) is disposed adjacent the microelectronic die side(s), wherein the packaging material includes at least one surface substantially planar to the microelectronic die active surface. A first dielectric material layer may be disposed on at least a portion of the microelectronic die active surface and the encapsulation material surface. At least one conductive trace is then formed on the first dielectric material layer to electrically contact the microelectronic die active surface. A barrier structure proximate an edge of the microelectronic package is formed simultaneously out of the same material as the conductive traces.

24 Claims, 13 Drawing Sheets

DIRECT BUILD-UP LAYER ON AN ENCAPSULATED DIE PACKAGE HAVING A MOISTURE BARRIER STRUCTURE

BACKGROUND OF THE INVENTION

1. Field of the Invention

The present invention relates to apparatus and processes for packaging microelectronic dice. In particular, the present invention relates to a packaging technology that fabricates build-up layers on a microelectronic die and on packaging material which surrounds the microelectronic die, wherein a moisture barrier structure is incorporated into the build-up layers.

2. State of the Art

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP".

Figure 4:
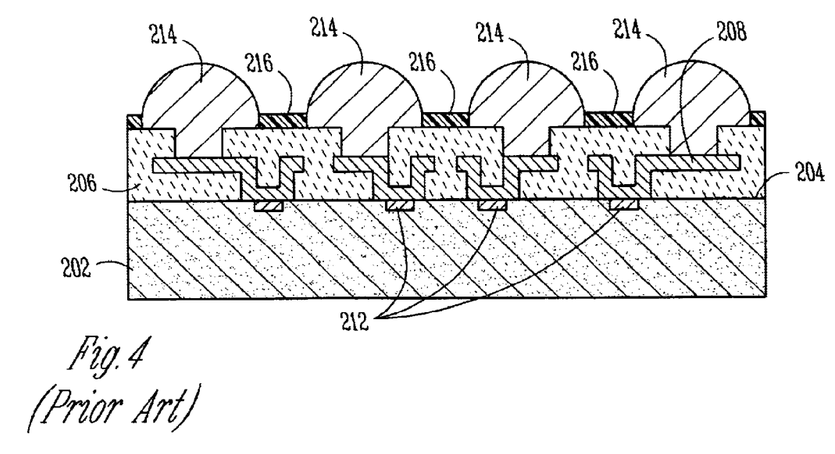
FIG. 4 is a cross-sectional view of a true CSP of a microelectronic device, as known in the art.

As shown in FIG. 4, true CSP would involve fabricating build-up layers directly on an active surface 204 of a microelectronic die 202. The build-up layers may include a dielectric layer 206 disposed on the microelectronic die active surface 204. Conductive traces 208 may be formed on the dielectric layer 206, wherein a portion of each conductive trace 208 contacts at least one contact 212 on the microelectronic die active surface 204. External contacts, such as solder balls or conductive pins for contact with an external component (not shown), may be fabricated to electrically contact at least one conductive trace 208. FIG. 4 illustrates the external contacts as solder balls 214 which are surrounded by a solder mask material 216 on the dielectric layer 206. However in such true CSP, the surface area provided by the microelectronic die active surface 204 generally does not provide enough surface for all of the external contacts needed to contact the external component (not shown) for certain types of microelectronic dice (i.e., logic).

Figure 5:
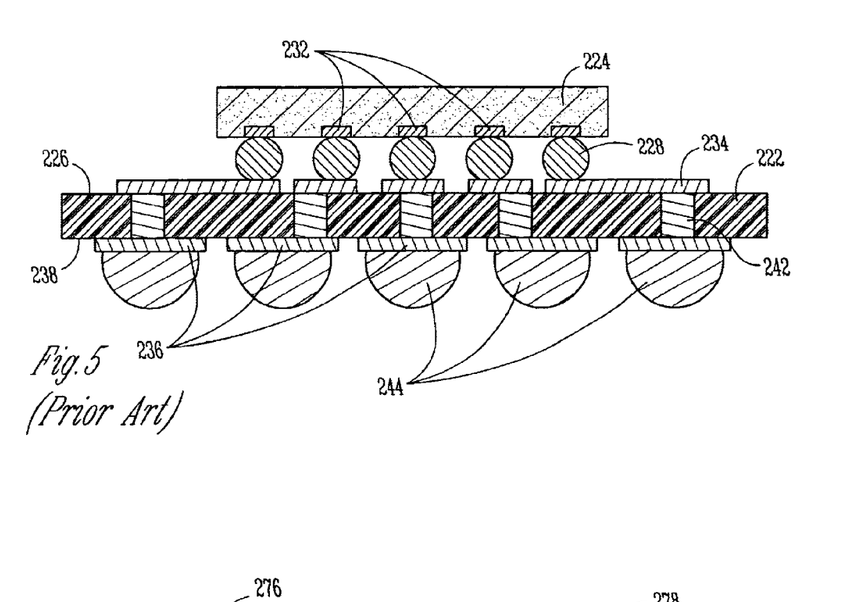
FIG. 5 is a cross-sectional view of a CSP of a microelectronic device utilizing a substrate interposer, as known in the art.

Additional surface area can be provided through the use of an interposer, such as a substrate (substantially rigid material) or a flex component (substantially flexible material). FIG. 5 illustrates a substrate interposer 222 having a microelectronic die 224 attached to and in electrical contact with a first surface 226 of the substrate interposer 222 through small solder balls 228. The small solder balls 228 extend between contacts 232 on the microelectronic die 224 and conductive traces 234 on the substrate interposer first surface 226. The conductive traces 234 are in discrete electrical contact with bond pads 236 on a second surface 238 of the substrate interposer 222 through vias 242 that extend through the substrate interposer 222. External contacts 244 (shown as solder balls) are formed on the bond pads 236. The external contacts 244 are utilized to achieve electrical communication between the microelectronic die 224 and an external electrical system (not shown).

The use of the substrate interposer 222 requires number of processing steps. These processing steps increase the cost of the package. Additionally, even the use of the small solder balls 228 presents crowding problems which can result in shorting between the small solder balls 228 and can present difficulties in inserting underfilling between the microelectronic die 224 and the substrate interposer 222 to prevent contamination and provide mechanical stability.

Figure 6:
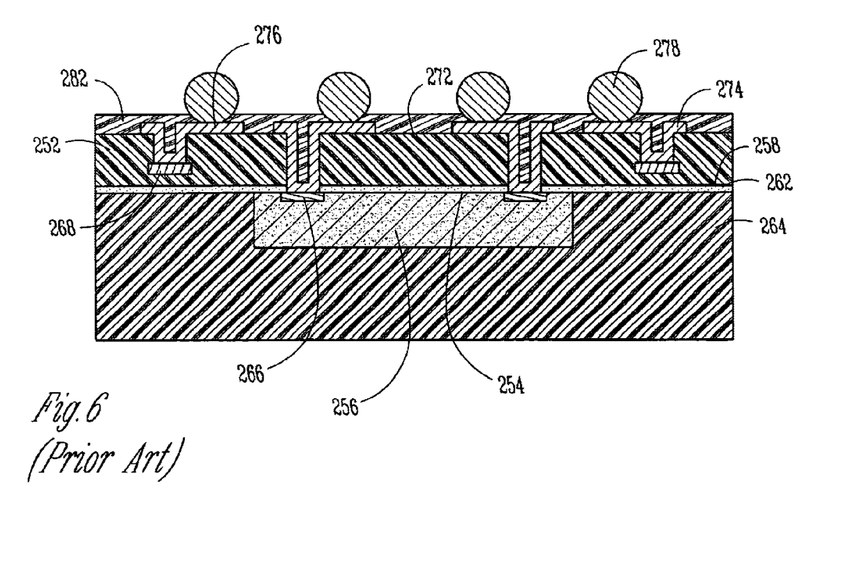
FIG. 6 is a cross-sectional view of a CSP of a microelectronic device utilizing a flex component interposer, as known in the art.

FIG. 6 illustrates a flex component interposer 252 wherein an active surface 254 of a microelectronic die 256 is attached to a first surface 258 of the flex component interposer 252 with a layer of adhesive 262. The microelectronic die 256 is encapsulated in an encapsulation material 264. Openings are formed in the flex component interposer 252 by laser abalation through the flex component interposer 252 to contacts 266 on the microelectronic die active surface 254 and to selected metal pads 268 residing within the flex component interposer 252. A conductive material layer is formed over a second surface 272 of the flex component interposer 252 and in the openings. The conductive material layer is patterned with standard photomask/etch processes to form conductive vias 274 and conductive traces 276. External contacts are formed on the conductive traces 276 (shown as solder balls 278 surrounded by a solder mask material 282 proximate the conductive traces 276).

The use of a flex component interposer 252 requires gluing material layers which form the flex component interposer 252 and requires gluing the flex component interposer 252 to the microelectronic die 256. These gluing processes are relatively difficult and may increase the cost of the package. Furthermore, the resulting packages have been found to have poor reliability.

Therefore, it would be advantageous to develop new apparatus and techniques to provide additional surface area to form traces for use in CSP applications.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although FIGS. 1a–1m, 2, and 3a–3q illustrate various views of the present invention, these figures are not meant to portray microelectronic assemblies in precise detail. Rather, these figures illustrate semiconductor assemblies in a manner to more clearly convey the concepts of the present invention. Additionally, elements common between the figures retain the same numeric designation.

Figure 1A:
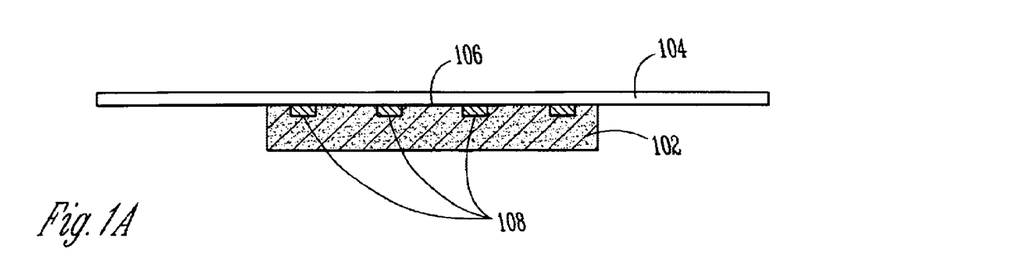
FIGS. 1a–1m are side cross-sectional views of embodiments of processes of forming a microelectronic package, according to the present invention.

The present invention includes a packaging technology that fabricates build-up layers on an encapsulated microelectronic die that has expanded area larger than that of the microelectronic die. FIGS. 1a–1j illustrate a first embodiment of a process of forming a microelectronic package of the present invention. As shown in FIG. 1a, a protective film 104 is abutted against an active surface 106 of a microelectronic die 102 to protect the microelectronic die active surface 106 from any contaminants. The microelectronic die active surface 106 has at least one contact 108 disposed thereon. The contacts 108 are in electrical contact with integrated circuitry (not shown) within the microelectronic die 102. The protective film 104 is preferably a substantially flexible material, such as Kapton® polyimide film (E. I. du Pont de Nemours and Company, Wilmington, Del.), but may be made of any appropriate material, including metallic films. The protective film 104 may have a weak, thermally stable adhesive, such as silicone, which attaches to the microelectronic die active surface 106. This adhesive-type film may be applied prior to placing the microelectronic die 102 in a mold or other such equipment used for the encapsulation process. The protective film 104 may also be a non-adhesive film, such as a ETFE (ethylene-tetrafluoroethylene) or Teflon® film, which is held on the microelectronic die active surface 106 by an inner surface of the mold or other such equipment during the encapsulation process.

Figure 1B:
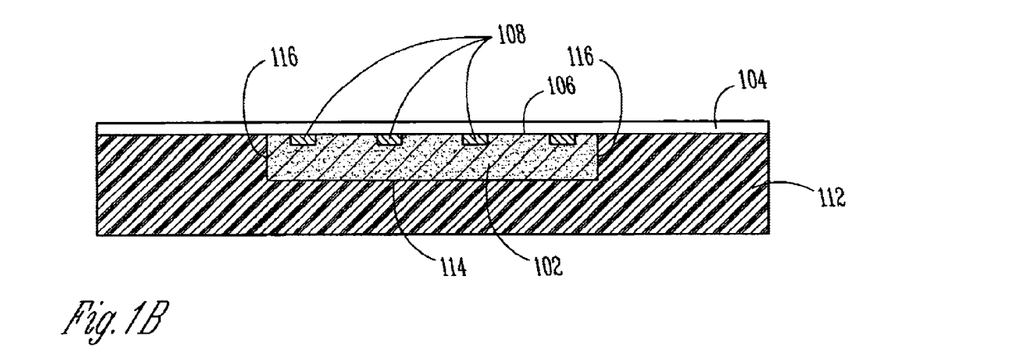

The microelectronic die 102 is then encapsulated with an encapsulation material 112, such as plastics, resins, epoxies, and the like, as shown in FIG. 1b, that covers a back surface 114 and side(s) 116 of the microelectronic die 102. The encapsulation of the microelectronic die 102 may be achieved by any known process, including but not limited to transfer and compression molding, and dispensing. The encapsulation material 112 provides mechanical rigidity, protects the microelectronic die 102 from contaminants, and provides surface area for the build-up of trace layers.

Figure 1C:
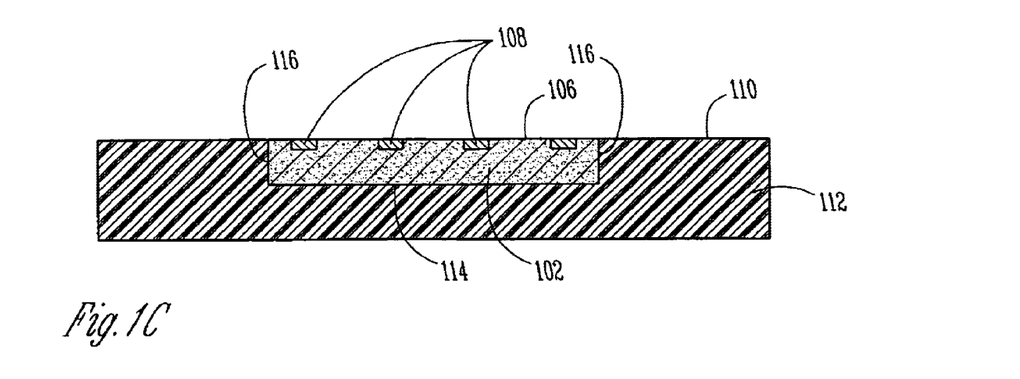

After encapsulation, the protective film 104 is removed, as shown in FIG. 1c, to expose the microelectronic die active surface 106. As also shown in FIG. 1c, the encapsulation material 112 is preferably molded to form at least one surface 110 which is substantially planar to the microelectronic die active surface 106. The encapsulation material surface 110 will be utilized in further fabrication steps as additional surface area for the formation of build-up layers, such as dielectric material layers and conductive traces.

Figure 1D:
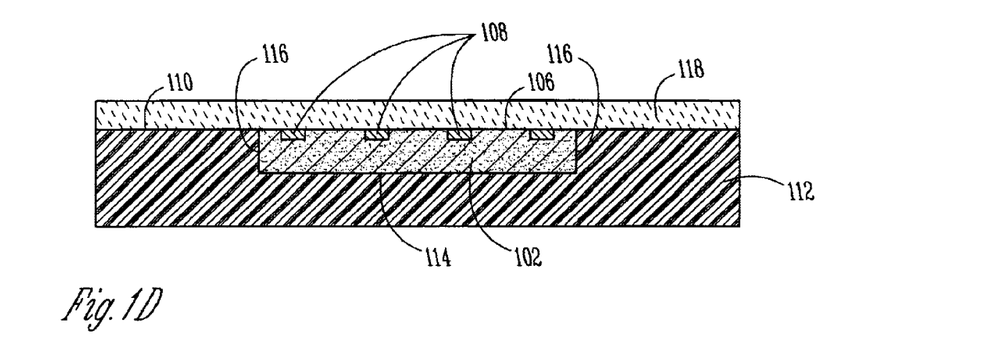

A first dielectric layer 118, such as epoxy resin, polyimide, bisbenzocyclobutene, and the like, is disposed over the microelectronic die active surface 106, the contacts 108, and the encapsulation material surface 110, as shown in FIG. 1d. The dielectric layers of the present invention are preferably filled epoxy resins available from Ibiden U.S.A. Corp., Santa Clara, Calif. U.S.A. and Ajinomoto U.S.A., Inc., Paramus, N.J., U.S.A. The formation of the first dielectric layer 118 may be achieved by any known process, including but not limited to film lamination, spin coating, roll-coating, and spray-on deposition.

Figure 1E:
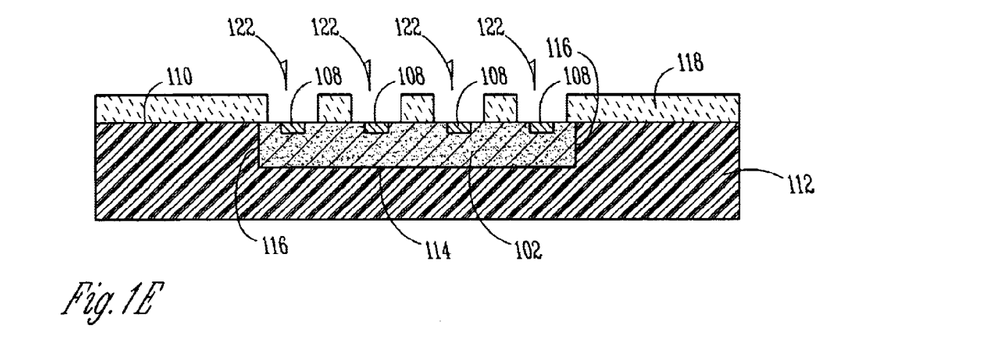

As shown in FIG. 1e, a plurality of vias 122 are then formed through the first dielectric layer 118. The plurality of vias 122 may be formed any method known in the art, including but not limited to laser drilling, photolithography, and, if the first dielectric layer 118 is photoactive, forming the plurality of vias 122 in the same manner that a photoresist mask is made in a photolithographic process, as known in the art.

Figure 1F:
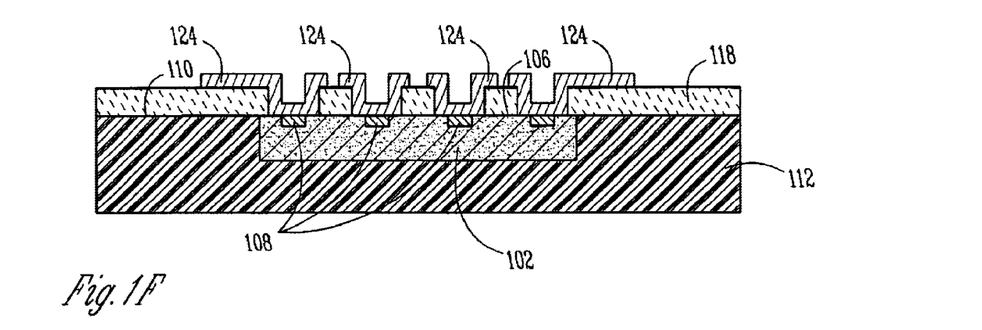

A plurality of conductive traces 124 is formed on the first dielectric layer 118, as shown in FIG. 1f, wherein a portion of each of the plurality of conductive traces 124 extends into at least one of said plurality of vias 122 to make electrical contact with the contacts 108. The plurality of conductive traces 124 may be made of any applicable conductive material, such as copper, aluminum, and alloys thereof. As shown in FIG. 1f, at least one conductive trace extends adjacent the microelectronic die active surface 106 and adjacent said encapsulation material surface 110.

The plurality of conductive traces 124 may be formed by any known technique, including but not limited to semi-additive plating and photolithographic techniques. An exemplary semi-additive plating technique can involve depositing a seed layer, such as sputter-deposited or electroless-deposited metal on the first dielectric layer 118. A resist layer is then patterned on the seed layer, followed by electrolytic plating of a layer of metal on the seed layer exposed by open areas in the patterned resist layer. The patterned resist layer is stripped and portions of the seed layer not having the layer of metal plated thereon is etched away. Other methods of forming the plurality of conductive traces 124 will be apparent to those skilled in the art.

Figure 1G:
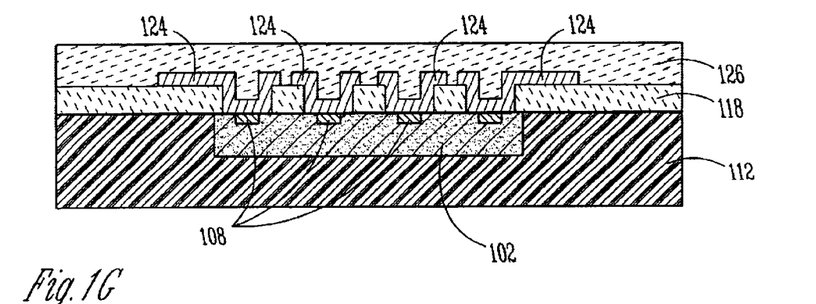

As shown in FIG. 1g, a second dielectric layer 126 is disposed over the plurality of conductive traces 124 and the first dielectric layer 118. The formation of the second dielectric layer 126 may be achieved by any known process, including but not limited to film lamination, roll-coating and spray-on deposition.

Figure 1H:
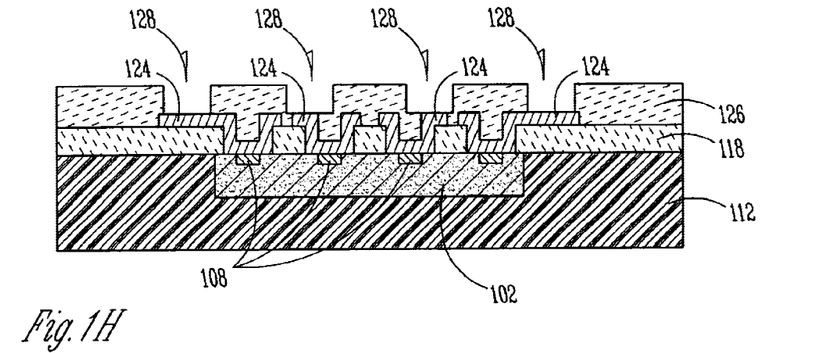

As shown in FIG. 1h, a plurality of second vias 128 are then formed through the second dielectric layer 126. The plurality of second vias 128 may be formed any method known in the art, including but not limited to laser drilling and, if the second dielectric layer 126 is photoactive, forming the plurality of second vias 128 in the same manner that a photoresist mask is made in a photolithographic process, as known in the art.

If the plurality of conductive traces 124 is not capable of placing the plurality of second vias 128 in an appropriate position, then other portions of the conductive traces are formed in the plurality of second vias 128 and on the second dielectric layer 126, another dielectric layer formed thereon, and another plurality of vias is formed in the dielectric layer, such as described in FIGS. 1f–1h. The layering of dielectric layers and the formation of conductive traces can be repeated until the vias are in an appropriate position. Thus, portions of a single conductive trace be formed from multiple portions thereof and can reside on different dielectric layers.

Figure 1I:
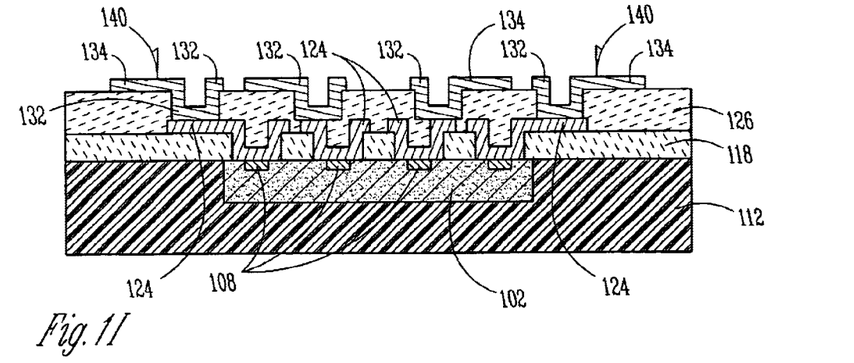

A second plurality of conductive traces 132 may be formed, wherein a portion of each of the second plurality of conductive traces 132 extends into at least one of said plurality of second vias 128. The second plurality of conductive traces 132 each include a landing pad 134 (an enlarged area on the traces demarcated by a dashed line 140), as shown in FIG. 1i.

Figure 1J:
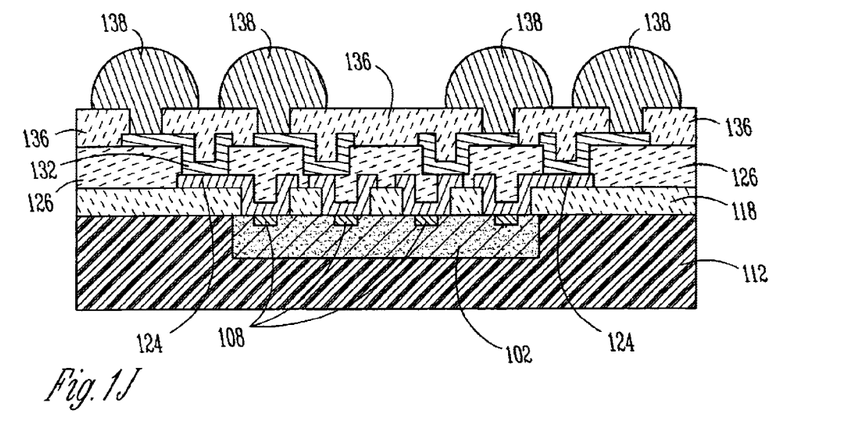

Once the second plurality of conductive traces 132 and landing pads 134 are formed, they can be used in the formation of conductive interconnects, such as solder bumps, solder balls, pins, and the like, for communication with external components (not shown). For example, a solder mask material 136 can be disposed over the second dielectric layer 126 and the second plurality of conductive traces 132 and landing pads 134. A plurality of vias is then formed in the solder mask material 136 to expose at least a portion of each of the landing pads 134. A plurality of conductive bumps 138, such as solder bumps, can be formed, such as by screen printing solder paste followed by a reflow process or by known plating techniques, on the exposed portion of each of the landing pads 134, as shown in FIG. 1j.

Figure 1K:
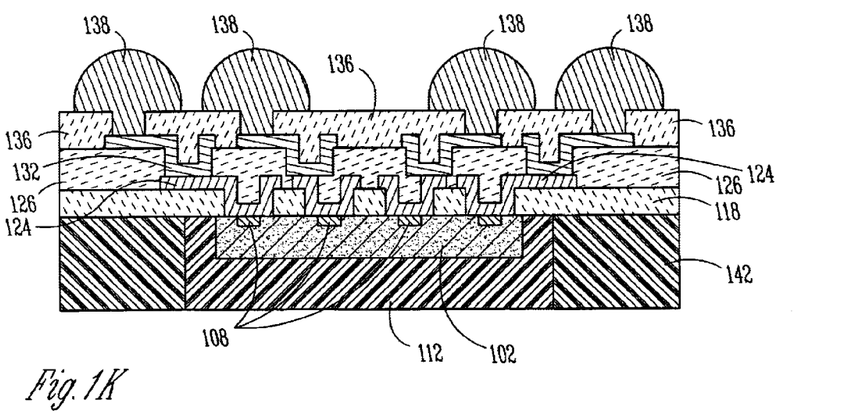
Figure 1L:
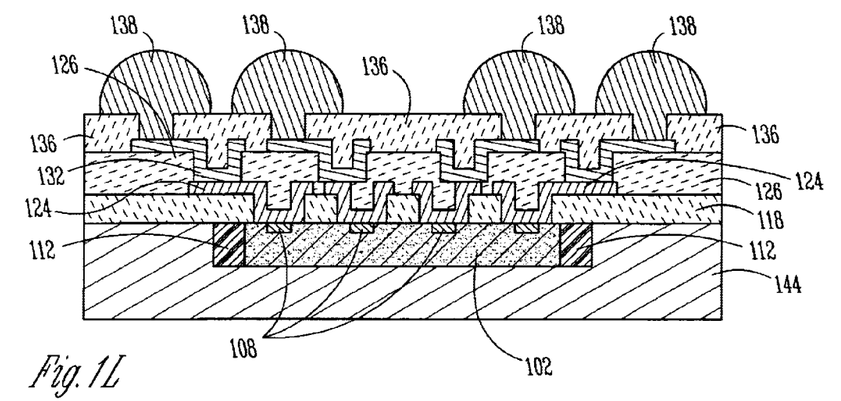

It is understood that the encapsulation material 112 is only one example of a packaging material that may be used. For example, a microelectronic package core 142 could be utilized as a packaging material along with the encapsulation material 112 in the fabrication of the microelectronic package, such as illustrated in FIG. 1k. The microelectronic package core 142 preferably comprises a substantially planar material. The material used to fabricate the microelectronic package core 142 may include, but is not limited to, a Bismaleimide Triazine ("BT") resin based material, an FR4 material (a flame retarding glass/epoxy material), and various polyimide materials. Furthermore, a heat spreader 144 could be utilized as a packaging material along with the encapsulation material 112 in the fabrication of the microelectronic package, such as illustrated in FIG. 1l. The material used to fabrication the heat spreader 144 may include any conductive and may include but is not limited to, copper, aluminum, and alloys thereof.

Figure 1M:
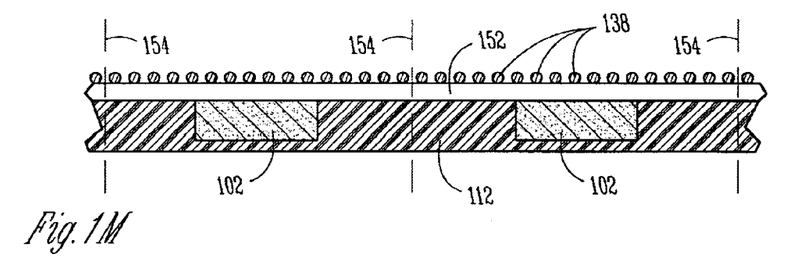

FIG. 1m illustrates a plurality of microelectronic dice 102 encapsulated with encapsulation material 112. The layer(s) of dielectric material and conductive traces comprising the build-up layer is simply designated together as build-up layer 152 in FIG. 1m. The individual microelectronic dice 102 are then singulated along lines 154 (cut) through the build-up layer 152 and the encapsulation material 112 to form at least one singulated microelectronic die package, such as shown in FIG. 1j. It is, of course, understood that the microelectronic package core 142 of FIG. 1k can be present and be singulated therethrough to form the microelectronic package shown in FIG. 1k. Additionally, it is understood that the heat spreader 144 of FIG. 1l can be present and be singulated therethrough to form the microelectronic package shown in FIG. 1l.

Although the build-up layer process illustrated in FIGS. 1a–1j is an effective technique for the fabrication of a microelectronic die package, it may be susceptible to delamination failure due to moisture encroachment. It has been found that moisture diffuses much more rapidly along the interfaces (shown with arrows 202 and 202' in FIG. 2) between the dielectric layers (i.e., dielectric layers 118, 126, and 136) than through the dielectric layer material itself.

Figure 2:
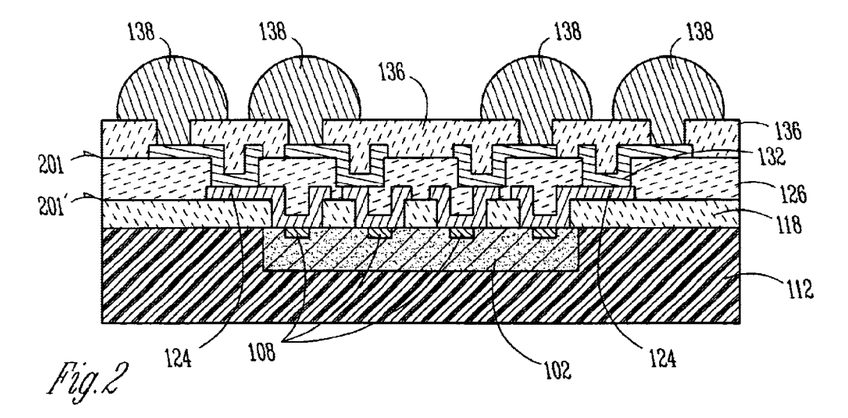
FIG. 2 is side cross-sectional view of detailing moisture encroachment into a microelectronic package.
Figure 3A:
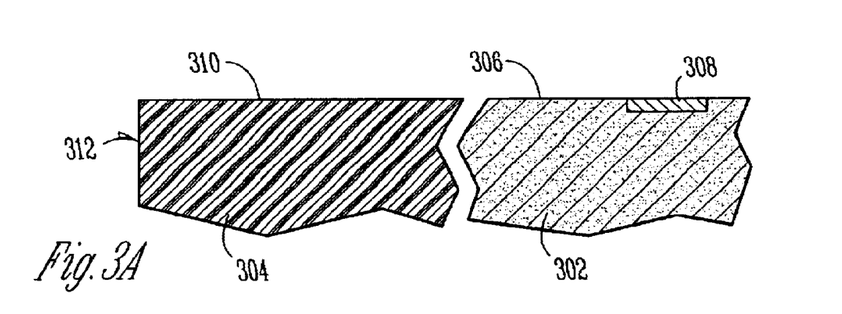
FIGS. 3a–3q are side cross-sectional views of a method for forming a barrier structure within build-up layers to substantially prevent moisture encroachment into the microelectronic package, according to the present invention.
Figure 3B:
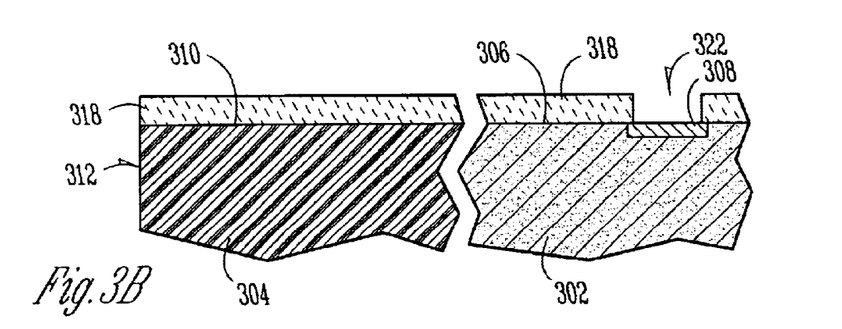
Figure 3C:
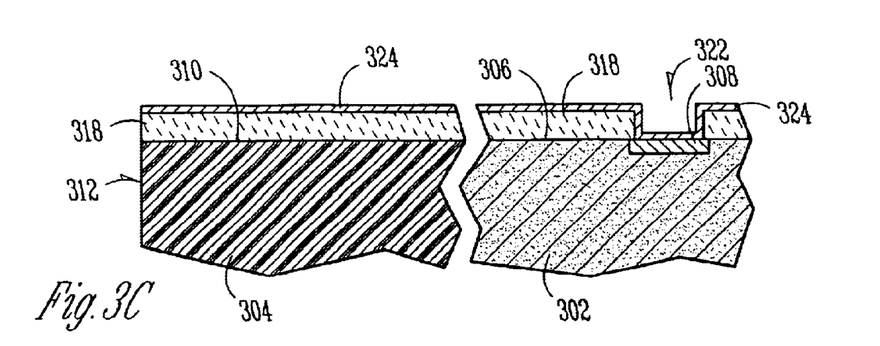
Figure 3D:
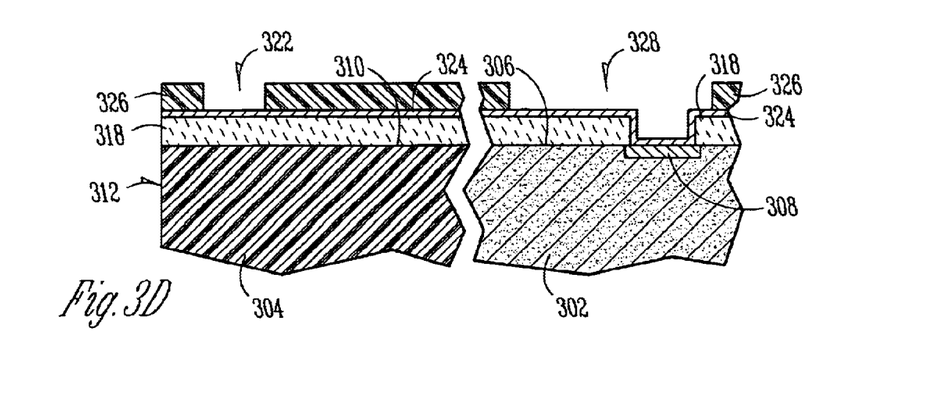
Figure 3E:
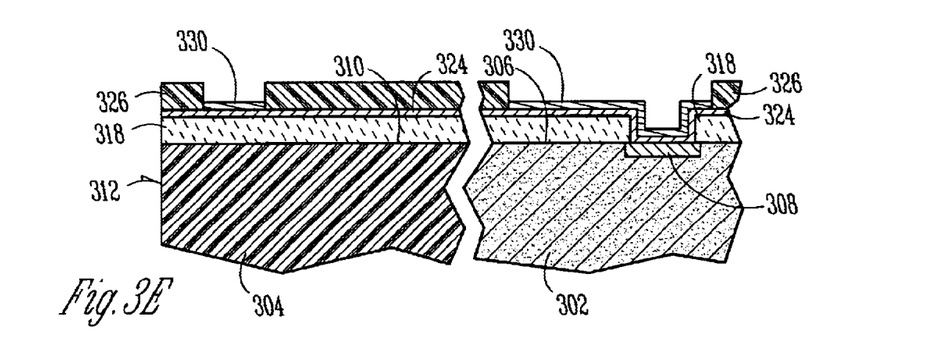
Figure 3F:
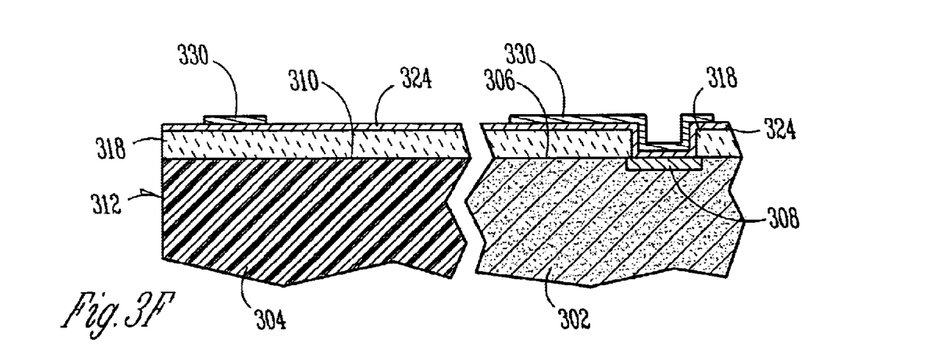
Figure 3G:
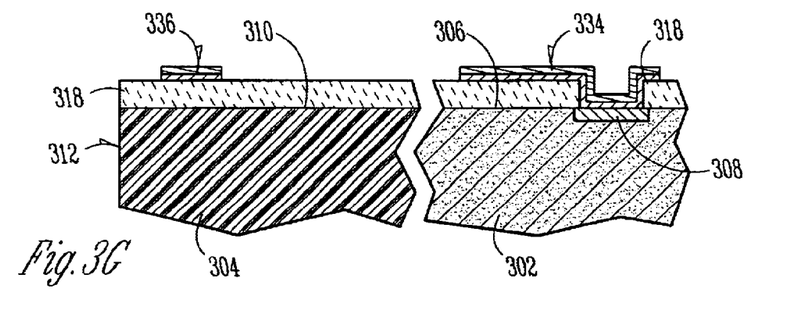
Figure 3H:
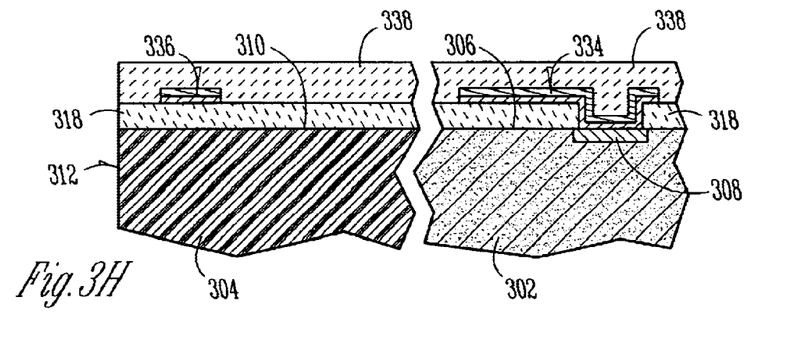
Figure 3I:
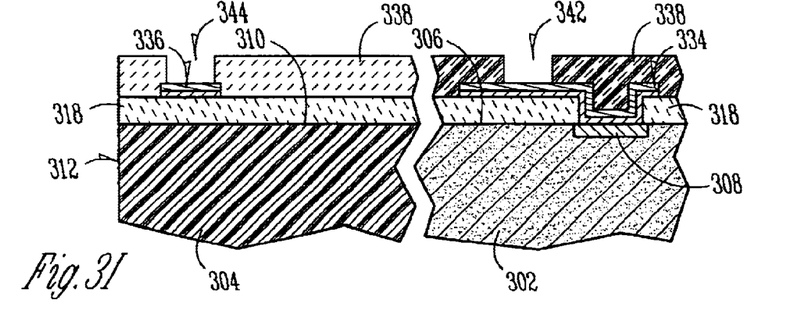
Figure 3J:
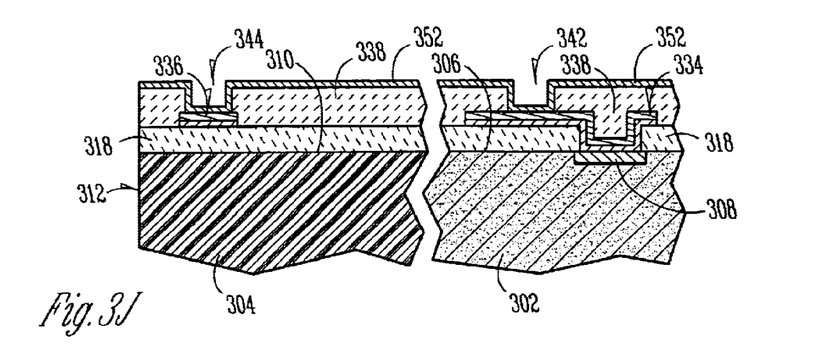
Figure 3K:
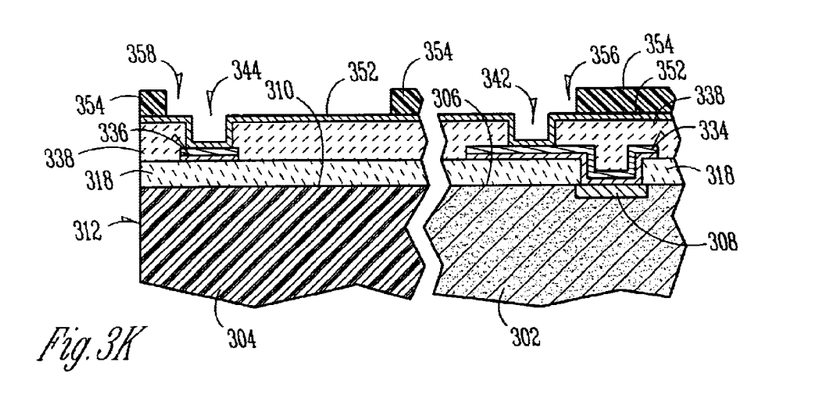
Figure 3L:
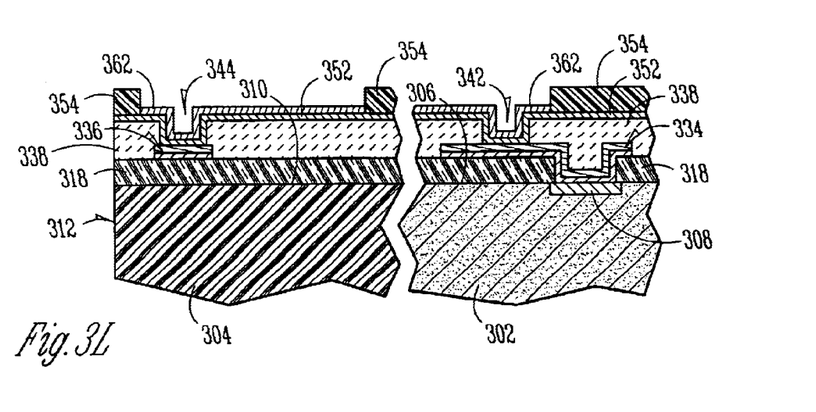
Figure 3M:
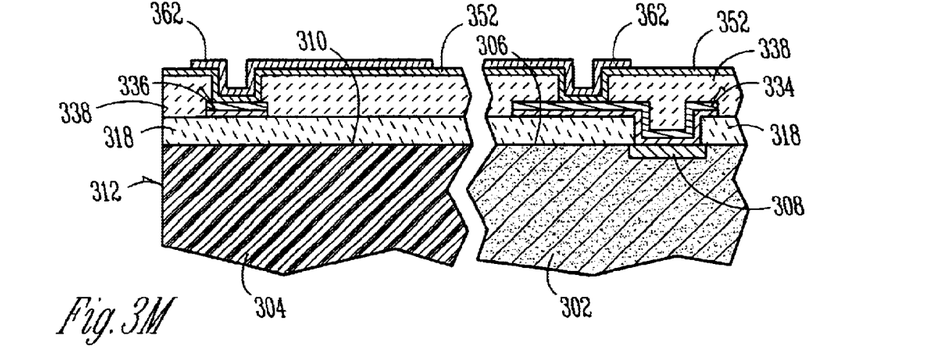
Figure 3N:
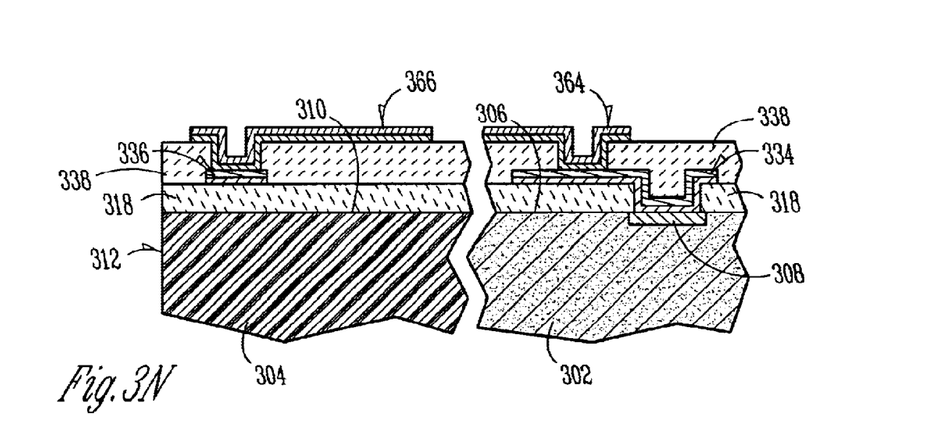
Figure 3O:
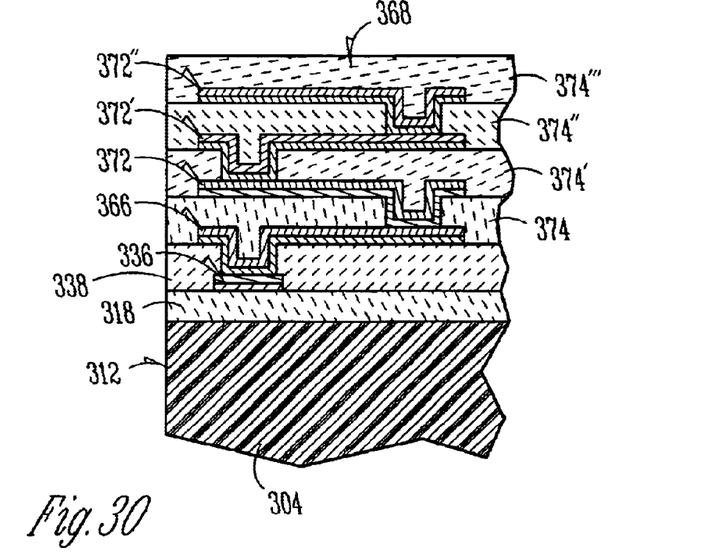

FIGS. 3a–3o illustrate a method of forming a barrier structure according to the present invention to lessen or eliminate the interlayer moisture encroachment and delamination, as described for FIG. 2. FIG. 3a illustrates a microelectronic die and packaging materials generally after fabrication steps shown in FIGS. 1a–1c. Thus, FIG. 3a shows a microelectronic die 302 having an active surface 306 and at least one contact 308. FIG. 3a further shows a substrate 304, adjacent to the microelectronic die 302, having a surface 310. The substrate 304 generically represents an encapsulation material 112 as described in FIGS. 1a–1j, a microelectronic packaging core 142 as described in FIG. 1k, the heat spreader 144 as described in FIG. 1l, or any applicable packaging material. The substrate 304 is shown having an edge 312. However, it is understood that the substrate edge 312 may not be formed until the individual microelectronic dice 302 are diced/separated, as described in FIG. 1m.

A first dielectric layer 318 is disposed over the microelectronic die active surface 306, the contacts 308, and the substrate surface 310 and at least one first via 322 is formed through the first dielectric layer 318 to expose at least one contact 308, as shown in FIG. 3b. A plurality of conductive traces and barrier structures are then formed on the first dielectric layer 318. The plurality of conductive traces and barrier structures are preferably formed by a semi-additive plating technique comprising depositing a first seed layer 324 of metal, preferably a copper/titanium alloy, over the first dielectric layer 318 and into the first via(s) 322 to cover the contact(s) 308, as shown in FIG. 3c. A first resist layer 326 is then patterned on the first seed layer 324, as shown in FIG. 3d. A first resist layer 326 is patterned with an first opening 328 including the first via 322 for subsequently forming a conductive trace and patterned with a first elongate opening 332 proximate the substrate edge 312 which extends substantially perpendicular to FIG. 3d for subsequently forming a first barrier structure.

A first layer of metal 330, preferably copper, is deposited, preferably by electrolytic plating, on the first seed layer 324 in the patterned areas of the first patterned resist layer 326, as shown in FIG. 3e. The first patterned resist layer 326 is then stripped, as shown in FIG. 3f. Portions of the first seed layer 324 not having the first metal layer 330 plated thereon is etched away, as shown in FIG. 3g. This results in the formation of at least one first conductive trace 334 and a first barrier structure 336 proximate the substrate edge 312. As shown in FIG. 3h, a second dielectric layer 338 is disposed over the first conductive trace(s) 334, the first barrier structure 336, and the first dielectric layer 318.

As shown in FIG. 3i, at least one second via 342 is then formed through the second dielectric layer 338 to the first conductive trace(s) 334 and a first trench 344 (extending perpendicular to FIG. 3i) is formed through the second dielectric layer 338 to the first barrier structure 336. The second via(s) 342 and the first trench 344 are formed in the same formation step by any appropriate method previously discussed.

As shown in FIG. 3j, a second seed layer 352 is deposited over the second dielectric layer 338, into the second via(s) 342 to contact the first conductive trace(s) 334, and into the first trench 344 to contact the first barrier structure 336. A second resist layer 354 is then patterned on the second seed layer 352, as shown in FIG. 3k. A second resist layer 354 is patterned with a second opening 356 including the second via(s) 342 for subsequently forming a second conductive trace and patterned with a second elongate opening 358 including the first trench 344 and extending perpendicular to FIG. 3d for subsequently forming a second barrier structure.

A second layer of metal 362 is deposited on the second seed layer 352 in the patterned areas of the second patterned resist layer 354, as shown in FIG. 3l. The second patterned resist layer 354 is then stripped, as shown in FIG. 3m. Portions of the second seed layer 352 not having the second metal layer 362 plated thereon is etched away, as shown in FIG. 3n. This results in the formation of at least one second conductive trace 364 and a second barrier structure 366 proximate the substrate edge 312.

The process is repeated until a build-up layer is complete, which will result in the formation of the moisture barrier structure 368, as shown in FIG. 3o. The moisture barrier structure 368 comprises the first barrier structure 336, the second barrier structure 366, and additional barrier structures shown as elements 372, 372', and 372" (additional dielectric layers 374, 374', 374", and 374'" are also shown). Since the moisture barrier structure 368 is fabricated with other conductive traces and via structures, no extra steps are needed in its formation. Furthermore, the moisture barrier structure 368 substantially blocks moisture from diffusing into build-up layers along interfaces, as previously discussed.

Figure 3P:
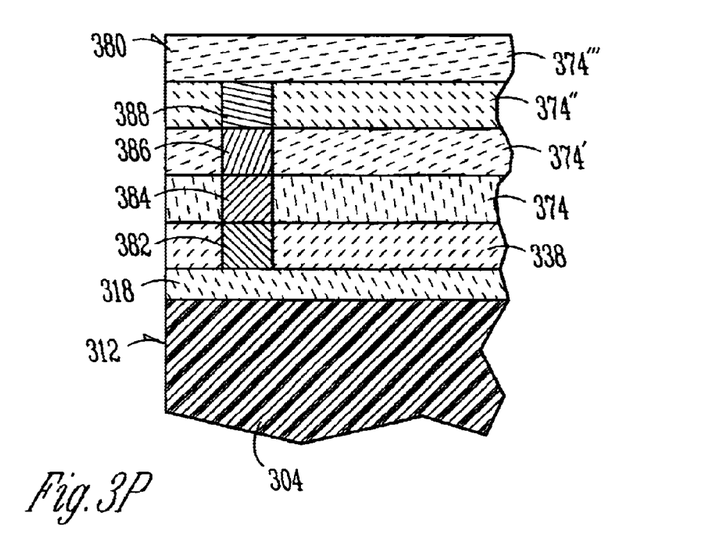

It is, of course, understood that the illustrated embodiment uses a technique that results in a somewhat zigzag cross-section for the moisture barrier structure 368, as shown in FIG. 3o, a technique may be devised which stacks a plurality of plugs in order to minimize space utilization. Such a moisture barrier structure 380 is shown in FIG. 3p and comprises a plurality of plugs 382, 384, 386, and 388 (additional dielectric layers 374, 374', 374", and 374''' are also shown).

Figure 3Q:
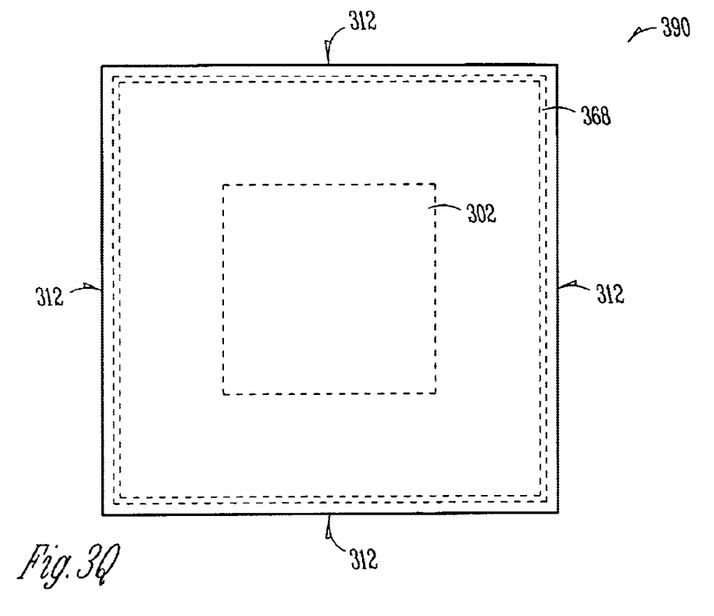

As shown in FIG. 3q which a top plan view of a complete microelectronic device 390, a moisture barrier structure 368 (shown in shadow lines) preferably surrounds the microelectronic die 302 (also shown in shadow line) proximate the substrate edges 312. Thus, the moisture barrier structure 368 forms a moisture barrier ring that substantially prevents moisture from encroaching into the microelectronic package from all sides of build-up layers.

Although the present invention is described in terms of a build-up layer technology, the broad concept of the present invention can be applied to other application where dielectric layers and trace layers are fabrication. Such applications include, but are not limited to, COF (chip-on-flex) and OLGA (organic land grid array) structures, as will be understood by those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A moisture barrier, comprising:
a packaging material having a surface and at least one edge, wherein said packaging material comprises a packaging core material;
a first dielectric material layer disposed on at least a portion of said packaging material surface; and
at least one first barrier structure disposed on said first dielectric material layer proximate said packaging material edge.

2. A moisture barrier, comprising:
a packaging material having a surface and at least one edge, wherein said packaging material comprises a heat spreader;
a first dielectric material layer disposed on at least a portion of said packaging material surface; and
at least one first barrier structure disposed on said first dielectric material layer proximate said packaging material edge.

3. A microelectronic package, comprising:
a microelectronic die having an active surface and at least one side;
packaging material adjacent said at least one microelectronic die side, wherein said packaging material including a surface substantially planar to said microelectronic die active surface and including at least one edge;
a first dielectric material layer disposed on at least a portion of said packaging material surface; and
at least one first barrier structure disposed on said first dielectric material layer proximate said packaging material edge.

4. The microelectronic package of claim 3, further including at least one additional dielectric material layer disposed over said at least one first barrier structure and said first dielectric material layer.

5. The microelectronic package of claim 4, further including at least one second barrier structure, wherein at least a portion of said at least one second barrier structure extends through said at least one additional dielectric material layer and contacts said at least one first barrier structure.

6. The microelectronic package of claim 3, wherein said packaging material comprises an encapsulation material.

7. The microelectronic package of claim 3, wherein said packaging material comprises a packaging core material.

8. The microelectronic package of claim 3, wherein said packaging material comprises a heat spreader.

9. A microelectronic package, comprising:
a microelectronic die having an active surface and at least one side;
packaging material adjacent said at least one microelectronic die side, wherein said packaging material including at least one surface substantially planar to said microelectronic die active surface and including at least one edge;
a first dielectric material layer disposed on at least a portion of said packaging material surface;
at least one first conductive trace disposed on said first dielectric material layer with a portion of said at least one first conductive trace extending through said first dielectric material layer to contact said microelectronic die active surface; and
at least one first barrier structure disposed on said first dielectric material layer proximate said packaging material edge.

10. The microelectronic package of claim 9, further including at least one additional dielectric material layer disposed over said at least one first barrier structure, said at least one first conductive trace, and said first dielectric material layer.

11. The microelectronic package of claim 10, further including at least one second barrier structure, wherein at least a portion of said at least one second barrier structure extends through said at least one additional dielectric material layer to contact said at least one first barrier structure.

12. The microelectronic package of claim 10, further including at least one second conductive trace, wherein at least a portion of said at least one second conductive trace extends through said at least one additional dielectric material layer to contact said at least one first conductive trace.

13. The microelectronic package of claim 9, wherein said packaging material comprises an encapsulation material.

14. The microelectronic package of claim 9, wherein said packaging material comprises a packaging core material.

15. The microelectronic package of claim 9, wherein said packaging material comprises a heat spreader.

16. A moisture barrier, comprising:
a packaging material having a surface and at least one edge;
a first dielectric material layer disposed on at least a portion of said packaging material surface; and
at least one first barrier structure disposed on said first dielectric material layer proximate said packaging material edge, wherein the first barrier structure includes at least one of a metal seed layer and a first layer of metal.

17. A moisture barrier, comprising:
a packaging material having a surface and at least one edge;
a first dielectric material layer disposed on at least a portion of said packaging material surface; and at least one first barrier structure disposed on said first dielectric material layer proximate said packaging material edge, wherein the first barrier structure includes a metal seed layer disposed over the first dielectric layer and a first layer of metal disposed over the metal seed layer, wherein the metal seed layer includes a copper/titanium alloy, and wherein the first layer of metal includes copper.

18. The microelectronic package of claim 3, further including:

a first conductive trace coupled to the die, and wherein the first barrier structure is disposed in a trench that is extending perpendicular to the first conductive trace.

19. The microelectronic package of claim 3, further including:

at least one additional dielectric material layer disposed over the at least one first barrier structure and the first dielectric material layer; and at least one second barrier structure, wherein at least a portion of the at least one second barrier structure extends through the at least one additional dielectric material layer and contacts the at least one first barrier structure, and wherein the at least one first barrier structure and the at least one second barrier structure result in a zigzag cross-section.

20. The microelectronic package of claim 3, further including:

at least one additional dielectric material layer disposed over the at least one first barrier structure and the first dielectric material layer; and at least one second barrier structure, wherein at least a portion of the at least one second barrier structure extends through the at least one additional dielectric material layer and contacts the at least one first barrier structure, and wherein the at least one first barrier structure and the at least one second barrier structure a comprise plurality of plugs.

21. The microelectronic package of claim 3, further including:

a first conductive trace coupled to the die; and a conductive bump coupled to the first conductive trace.

22. The microelectronic package of claim 9, further including:

at least one additional dielectric material layer disposed over the at least one first barrier structure and the first dielectric material layer; and at least one second barrier structure, wherein at least a portion of the at least one second barrier structure extends through the at least one additional dielectric material layer and contacts the at least one first barrier structure, and wherein the at least one first barrier structure and the at least one second barrier structure result in a zigzag cross-section.

23. The microelectronic package of claim 9, further including:

at least one additional dielectric material layer disposed over the at least one first barrier structure and the first dielectric material layer; and at least one second barrier structure, wherein at least a portion of the at least one second barrier structure extends through the at least one additional dielectric material layer and contacts the at least one first barrier structure, and wherein the at least one first barrier structure and the at least one second barrier structure a comprise plurality of plugs.

24. The microelectronic package of claim 9, further including:

a first conductive trace coupled to the die; and a conductive bump coupled to the first conductive trace.

* * * * *

UNITED STATES PATENT AND TRADEMARK OFFICE
CERTIFICATE OF CORRECTION

PATENT NO.   : 6,713,859 B1  
DATED        : March 30, 2004  
INVENTOR(S)  : Ma

Page 1 of 1

It is certified that error appears in the above-identified patent and that said Letters Patent is hereby corrected as shown below:

Column 9,  
Line 37, after "structure" delete "a".  
Line 38, insert -- a -- before "plurality".

Column 10,  
Line 30, after "structure" delete "a".  
Line 31, insert -- a -- before "plurality".

Signed and Sealed this

Third Day of August, 2004

JON W. DUDAS  
*Acting Director of the United States Patent and Trademark Office*